(12) United States Patent
Jin

(10) Patent No.: US 11,721,553 B2
(45) Date of Patent: Aug. 8, 2023

(54) FORMATION METHOD OF SEMICONDUCTOR DEVICE USING MASK LAYER AND SIDEWALL SPACER MATERIAL LAYER TO FORM TRENCHES

(71) Applicants: Semiconductor Manufacturing International (Shanghai) Corporation, Shanghai (CN); Semiconductor Manufacturing International (Beijing) Corporation, Beijing (CN)

(72) Inventor: Jisong Jin, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 114 days.

(21) Appl. No.: 17/249,422

(22) Filed: Mar. 2, 2021

(65) Prior Publication Data
US 2021/0280423 A1  Sep. 9, 2021

(30) Foreign Application Priority Data
Mar. 5, 2020  (CN) .......................... 202010148879.X

(51) Int. Cl.
*H01L 21/033* (2006.01)

(52) U.S. Cl.
CPC ...... *H01L 21/0338* (2013.01); *H01L 21/0332* (2013.01); *H01L 21/0335* (2013.01); *H01L 21/0337* (2013.01)

(58) Field of Classification Search
CPC ............. H01L 21/0338; H01L 21/0332; H01L 21/0335; H01L 21/76816; H01L 21/31144
USPC ......................................................... 438/700
See application file for complete search history.

(56) References Cited

U.S. PATENT DOCUMENTS

| | | | |
|---|---|---|---|
| 6,458,516 B1 * | 10/2002 | Ye ..................... | H01L 21/32139 430/311 |
| 7,968,467 B2 * | 6/2011 | Choi ................. | H01L 27/11524 438/689 |
| 8,298,943 B1 * | 10/2012 | Arnold ............. | H01L 21/76811 438/669 |
| 9,455,194 B1 * | 9/2016 | Feng .................. | H01L 21/3086 |
| 9,773,680 B1 * | 9/2017 | Zang ............... | H01L 21/823431 |
| 10,446,407 B2 * | 10/2019 | Sherpa ................ | H01J 37/3244 |
| 10,635,007 B1 * | 4/2020 | Yang ................... | G03F 7/70683 |

(Continued)

*Primary Examiner* — Kimberly N Rizkallah
*Assistant Examiner* — Pratiksha Jayant Lohakare
(74) *Attorney, Agent, or Firm* — Anova Law Group, PLLC

(57) ABSTRACT

A method for forming a semiconductor device includes providing a to-be-etched layer, forming a first mask layer on the to-be-etched layer, forming a patterned core layer on the first mask layer of a first region, forming a sidewall spacer material layer on the core layer and the first mask layer, removing the sidewall spacer material layer on a top surface of the core layer, removing the core layer and the first mask layer at a bottom of the core layer to form a first trench, removing the sidewall spacer material layer on the first mask layer of a second region, forming a first patterned layer exposing the first mask layer of the second region, and using the first patterned layer as a mask to remove the first mask layer of the second region to form a second trench.

12 Claims, 21 Drawing Sheets

(56) References Cited

U.S. PATENT DOCUMENTS

| | | | | |
|---|---|---|---|---|
| 2010/0291771 A1* | 11/2010 | Zhou | ................. | H01L 21/31122 |
| | | | | 438/591 |
| 2015/0243503 A1* | 8/2015 | Leobandung | ..... | H01L 21/28132 |
| | | | | 438/427 |
| 2016/0365311 A1* | 12/2016 | Hung | ................ | H01L 27/11519 |
| 2017/0125248 A1* | 5/2017 | Siew | ................... | H01L 21/0332 |

* cited by examiner

FORMATION METHOD OF SEMICONDUCTOR DEVICE USING MASK LAYER AND SIDEWALL SPACER MATERIAL LAYER TO FORM TRENCHES

CROSS-REFERENCE TO RELATED APPLICATION

This application claims the priority of Chinese Patent Application No. 202010148879.X, filed on Mar. 5, 2020, the entire content of which is hereby incorporated by reference.

FIELD OF THE DISCLOSURE

The present disclosure generally relates to the field of semiconductor manufacturing technology field and, more particularly, relates to a semiconductor device formation method.

BACKGROUND

With the improvement of integration and scale of a circuit, a size of a unit device continues to decrease in the circuit, and requirements of an integrated circuit (IC) manufacturing process continues to increase. For example, a critical size continues to decrease, and chip manufacturing has an increasing requirement for lithography resolution. As a design size continues to decrease, a smallest resolution of a design image has exceeded a limit capability of an existing optical lithography platform. A plurality of technical solutions are used to solve this technical problem. According to the blueprint of international semiconductor technology, the technical solutions of dual patterning technology (DPT), extreme ultraviolet technology (EUV), electron beam lithography (EBL), etc., are interested in the semiconductor industry.

A plurality of two-time patterning processes are provided. The two-time patterning process using a litho-etch-litho-etch (LELE) process is a common method of the existing plurality of two-time patterning processes. The LELE process method needs to divide the image into two parts. Then, each of the two separate photolithography processes generates a part of the pattern, respectively. However, lithography, etching, and deposition may generate an edge placement error (EPE), which results in a vertical alignment deviation between layers. The EPE may eventually affect the performance of the formed semiconductor device. To reduce the EPE, a patterning technology based on a sidewall process is provided, e.g., self-alignment LELE technology based on the sidewall process.

When the self-alignment LELE technology based on the sidewall process is used to form a metal wire, a first trench is generally formed first, then a sidewall is formed on an inner surface of the first trench. The sidewall is used as an alignment reference for second photolithography. As such, self-alignment is realized for forming a second trench by the second photolithography, and the EPE is reduced. Then, a base substrate is patterned based on the first trench, the sidewall of the inner surface of the first trench, and the second trench.

However, when metal is filled in the first trench to form a first metal wire, the sidewall on the inner surface of the first trench affects a head to head (HTH) of formed neighboring first metal wires. Therefore, a dimension of the HTH between the formed neighboring first metal wires is large, and the dimension of the formed HTH does not match an expected target.

BRIEF SUMMARY OF THE DISCLOSURE

The present disclosure provides a method for forming a semiconductor device to reduce a dimension of a device, form a smaller dimension of a head to head (HTH), and cause the HTH to match an expected target.

One aspect of the present disclosure includes a method for forming a semiconductor device. The method includes providing a to-be-etched layer, forming a first mask layer on the to-be-etched layer, forming a patterned core layer on the first mask layer of a first region, forming a sidewall spacer material layer on a top surface, a sidewall surface of the core layer, and a surface of the first mask layer, removing the sidewall spacer material layer on the top surface of the patterned core layer, removing the patterned core layer and the first mask layer at a bottom of the patterned core layer to form a first trench in the first mask layer of the first region, removing the sidewall spacer material layer on the surface of the first mask layer of a second region, forming a first patterned layer exposing the first mask layer of the second region, and using the first patterned layer as a mask to remove the first mask layer of the second region to form a second trench in the first mask layer of the second region. The to-be-etched layer includes a plurality of first regions and a plurality of second regions. The plurality of first regions and the plurality of second regions are alternatively arranged. The first region of the plurality of first regions adjoins a corresponding second region of the plurality of second regions.

Optionally, after the second trench is formed in the first mask layer of the second region, the first trench is formed in the first mask layer of the first region.

Optionally, forming the second trench in the first mask layer of the second region includes removing the sidewall spacer material layer on the top surface of the core layer and the surface of the first mask layer and keeping the sidewall spacer material layer on the sidewall surface of the core layer to form a sidewall spacer, forming the first patterned layer on the surface of the first mask layer, the top surface of the core layer, and the top surface and the sidewall surface of the sidewall spacer, and using the first patterned layer as a mask to etch and remove the first mask layer to form the second trench in the first mask layer of the second region. A portion of the sidewall spacer is located in the second region. The first patterned layer exposes the first mask layer of the second region and a portion of the top surface of the sidewall spacer of the second region.

Optionally, forming the first trench in the first mask layer of the first region includes forming a second patterned layer in the second trench, etching back the first patterned layer and the second patterned layer until the top surface of the core layer is exposed, removing the core layer to expose a portion of the first mask layer of the first region, and etching and removing the exposed first mask layer of the first region to form the first trench in the first mask layer of the first region. The second patterned layer covers the to-be-etched layer of the second region and the top surface and sidewall surface of the sidewall spacer of the second region. A top surface of the second patterned layer is coplanar with a top surface of the first patterned layer.

Optionally, a material of the second patterned layer and a material of the first patterned layer are same and include an organic dielectric material.

Optionally, after the first trench is formed in the first mask layer of the first region, the second trench is formed in the first mask layer of the second region.

Optionally, forming the first trench in the first mask layer of the first region includes removing the sidewall spacer material layer on the top surface of the core layer and keeping the sidewall spacer material layer on the sidewall surface of the core layer and the surface of the first mask layer, removing the core layer to expose a portion of the first mask layer of the first region, and etching and removing the exposed portion of the first mask layer of the first region to form the first trench in the first mask layer of the first region.

Optionally, forming the second trench in the first mask layer of the second region includes removing the sidewall spacer material layer on the surface of the first mask layer of the second region and keeping the sidewall spacer material layer on the sidewall surface of the core layer to form the sidewall spacer, forming the first patterned layer on the surface of the first mask layer, on the to-be-etched layer of the first region, and the top surface and the sidewall surface of the sidewall spacer, and using the first patterned layer as a mask to etch and remove a portion of the first mask layer of the second region to form the second trench in the first mask layer of the second region. A portion of the sidewall spacer is located in the second region. The first patterned layer exposes the first mask layer of the second region and a portion of the top surface of the sidewall spacer located in the second region.

Optionally, a material of the first patterned layer includes an organic dielectric material.

Optionally, a material of the sidewall spacer material layer includes silicon oxide ($SiO_2$), silicon nitride (SiN), titanium oxide ($TiO_2$), titanium nitride (TiN), aluminum nitride (AlN), or aluminum oxide ($Al_2O_3$).

Optionally, after forming the first trench and the second trench, the method further includes removing the first patterned layer and the sidewall spacer material layer on the sidewall surface of the core layer.

Optionally, the method further includes etching the to-be-etched layer at bottom of the first trench to form a first target trench in the to-be-etched layer of the first region, etching the to-be-etched layer at bottom of the second trench to form a second target trench in the to-be-etched layer of the second region, forming a first conductive layer in the first target trench, and forming a second conductive layer in the second target trench.

As disclosed, the technical solutions of the present disclosure have the following advantages.

Before the first trench and the second trench are formed in the first mask layer, the patterned core layer is formed on the mask layer first. The patterned core layer defines the position and dimension of the to-be-formed first trench. Then, the sidewall spacer material layer is formed at the sidewall surface and the top surface of the core layer, and the surface of the first mask layer. Since the sidewall spacer material layer is formed before the first trench is formed and is located outside of the to-be-formed first trench, when the first trench is subsequently formed, the pattern of the first trench is consistent with the pattern of the core layer. When the pattern of the first trench in the first mask layer is transferred to the to-be-etched layer, the impact of the sidewall spacer layer is avoided to cause the formed pattern of the first target trench to be consistent with the first trench. Moreover, when the first conductive layer is formed in the first target trench, the HTH between the neighboring first conductive layers is the HTH of the first trench, which is not affected by the sidewall spacer material layer. Thus, a smaller HTH may be obtained.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions, and advantages of the present disclosure more clear and explicit, the present disclosure is described in further detail with accompanying drawings and embodiments. It should be understood that the specific exemplary embodiments described herein are only for explaining the present disclosure and are not intended to limit the present disclosure.

According to the background technology, nowadays, when the extreme ultraviolet (UV) technology is combined with litho-etch-litho-etch (LELE), the head-to-head (HTH) between neighboring metal wires formed is still relatively large and does not match the expected target.

FIGS. 1 to 5 illustrate schematics of semiconductor structures corresponding to certain stages of a process for forming a semiconductor device.

Figure 1:
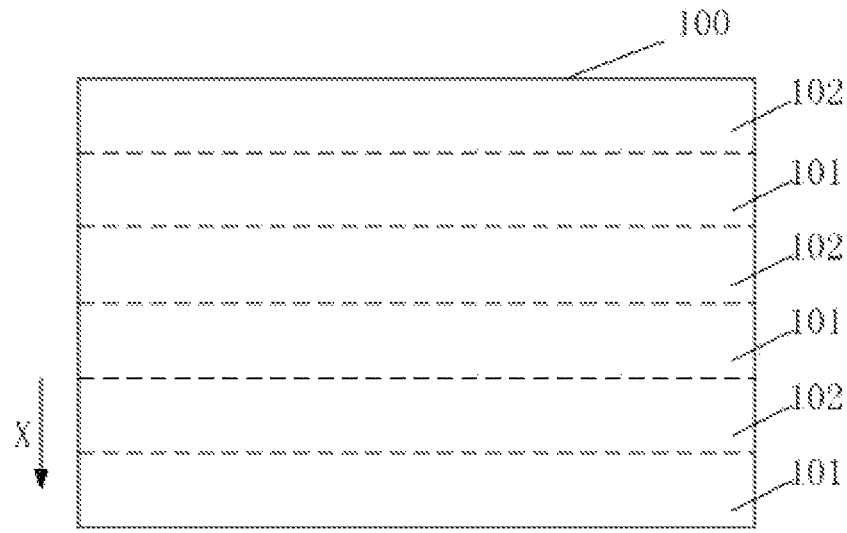
FIGS. 1 to 5 illustrate schematics of semiconductor structures corresponding to certain stages of a process for forming a semiconductor device.

Referring to FIG. 1, a to-be-etched layer 100 is provided. The to-be-etched layer 100 includes a plurality of separate first regions 101 and a plurality of separate second regions 102. The plurality of first regions 101 and the plurality of second regions 102 are alternatively arranged along a first direction X. A first region 101 of the plurality of first regions 101 adjoins a second region 102 of the plurality of second regions 102.

Figure 2:
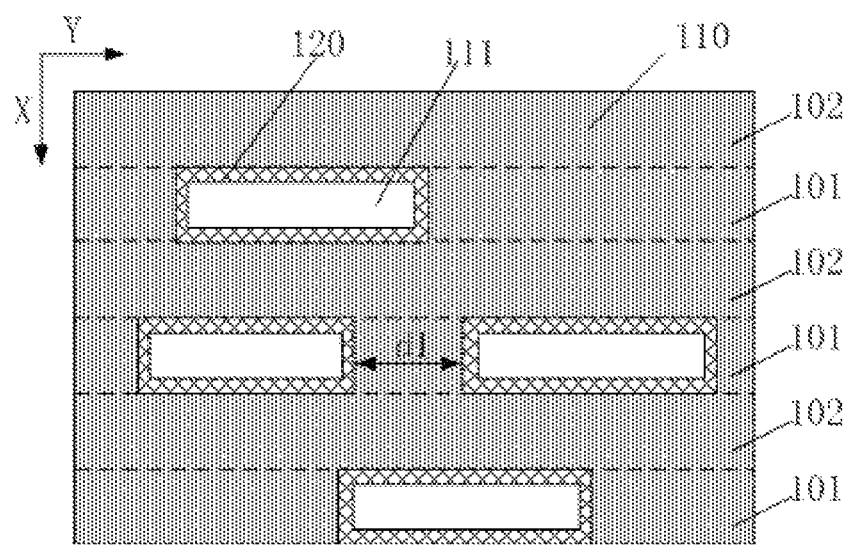

Referring to FIG. 2, a first mask layer 110 is formed on the plurality of first regions 101 and the plurality of second regions 102 of the to-be-etched layer 100. A plurality of first trenches 111 are formed in the first mask layer 110 of the plurality of first regions 101. The plurality of trenches 111 are separated from each other.

The HTH between neighboring first trenches 111 along a second direction Y is d1. The second direction Y is perpendicular to the first direction X.

Referring back to FIG. 2, a sidewall spacer 120 is formed on a sidewall surface of a first trench 111. The sidewall spacer 120 is used as an alignment reference for subsequently forming a second trench by second photolithography.

Figure 3:
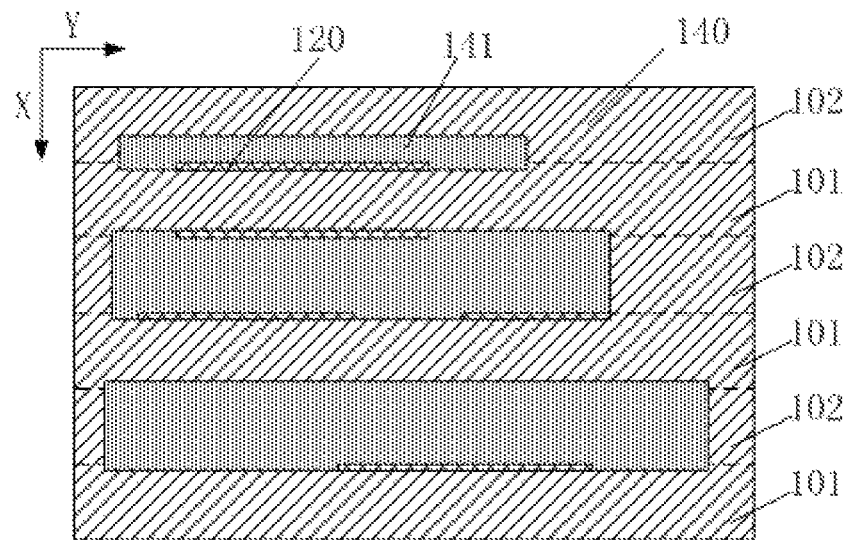

Referring to FIG. 3, a first patterned layer 140 is formed on the first mask layer 110. The first patterned layer 140 includes a plurality of openings 141. Each opening 141 exposes a portion of the first mask layer 110 of the second region 102 and a portion of a top surface of the sidewall spacer 120 of the sidewall surface of the first trench 111.

The opening 141 may define a position and dimension of the second trench to be formed.

The sidewall spacer 120 may provide the alignment reference for forming the first patterned layer 140, forming the opening 141 in the first patterned layer 140, and the subsequent second etching to reduce an edge placement error (EPE).

Figure 4:
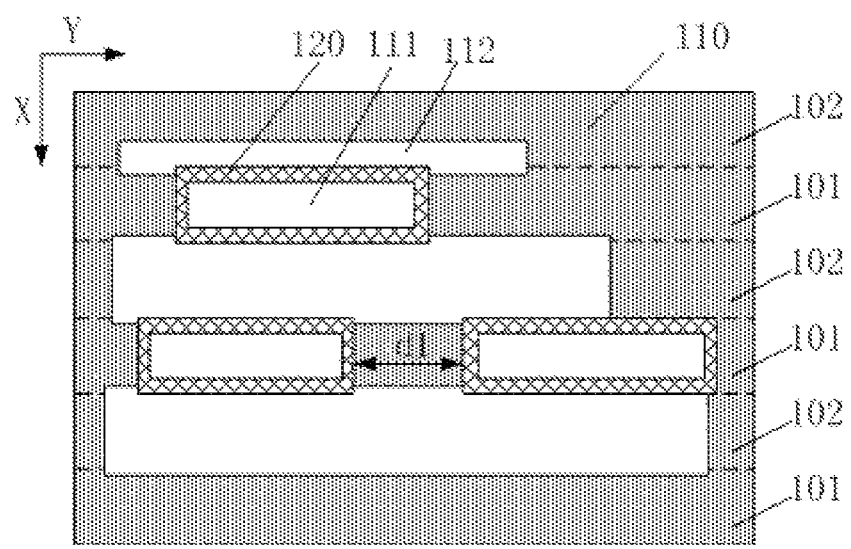

Referring to FIG. 4, the first patterned layer 140 is used as a mask to etch the first mask layer 110 exposed by the opening 141 to form the second trench 112 in the first mask layer 110 of the second region 102. A sidewall surface of the second trench 112 exposes the sidewall spacer 120. The first patterned layer 140 is removed.

Figure 5:
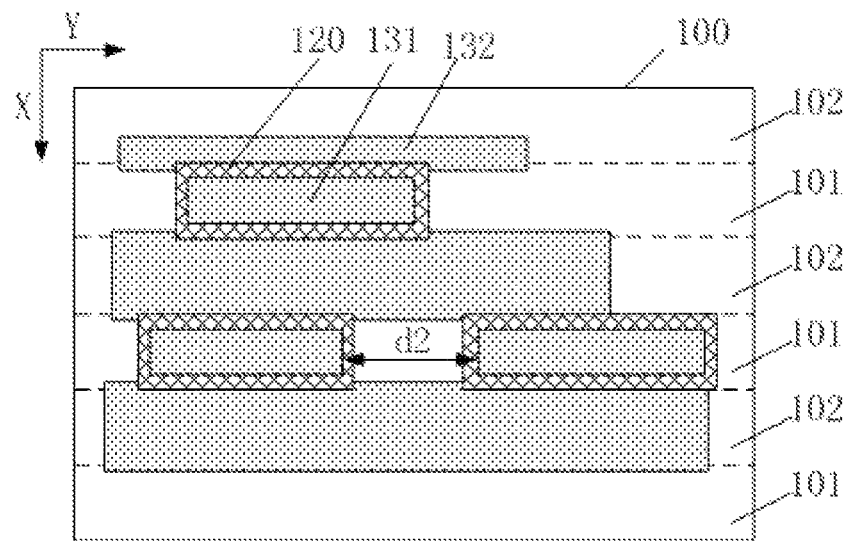

Referring to FIG. 5, the to-be-etched layer 100 at the bottom of the first trench 111 is etched to form a first target trench (not shown) in the to-be-etched layer 100. The to-be-etched layer 100 at the bottom of the second trench 112 is etched to form a second target trench (not shown) in the to-be-etched layer 100. A first metal wire 131 is formed in the first target trench, and a second metal wire 132 is formed in the second target trench.

An HTH between neighboring first metal wires 131 along the second direction Y is d2.

The inventors of the present disclosure have found that a semiconductor device formed by the method described above may have an undesirable dimension of the HTH of the neighboring first metal wires. In this method, the first trench is first formed, and then the sidewall spacer is formed on the sidewall surface of the first trench. The formed sidewall spacer is located in the first trench. When the metal is subsequently filled in the first trench to form the first metal wire, the HTH between the neighboring first metal wires is d2. That is, the dimension of the HTH is a sum of the HTH d1 of the first trench and thicknesses of two sidewall spacers, which cause the dimension of the HTH of the formed neighboring first metal wires not to satisfy a minimal dimension requirement and match the expected target. To form an HTH with a smaller dimension, a cut process may need to be performed additionally. A first metal wire formed by cutting may increase the cost. Moreover, since no sidewall spacer is formed on the sidewall surface of the second trench, the dimension of the HTH of the neighboring first metal wires may have a large difference from the dimension of the HTH of the neighboring second metal wires, which may cause a wire connecting process between the metal wires difficult to perform and affect the performance of the semiconductor device negatively.

To solve the above-described problem, the inventors of the present disclosure have found through research that a forming method may be provided to form the semiconductor device. Before forming the first trench or the second trench in the first mask layer, a patterned core layer may be formed in the first region of the first mask layer. A sidewall spacer material layer may be formed on the sidewall surface and top surface of the core layer and the surface of the first mask layer. During the process of forming the first trench and the second trench, the sidewall spacer material layer on the top surface of the core layer and the surface of the first mask layer may be removed, and the sidewall spacer material layer on the sidewall surface of the core layer is retained to form the sidewall spacer. The retained sidewall spacer may be used as the alignment reference for forming the second trench by the second photolithography. Since the sidewall used as the alignment reference is located on the surface of the first mask layer, not in the first trench, when a first conductive layer is subsequently formed in the to-be-etched layer, the formed first conductive layer may not be affected by the first conductive layer. Since neighboring first conductive layers are not blocked by the sidewall spacer, the HTH is closer, that is, a smaller HTH may be formed, and the formed first conductive layers match the expected target.

To make the purpose, feature, and beneficial effect clearer, specific embodiments of the present disclosure are described in detail in connection with accompanying drawings.

Figure 39:
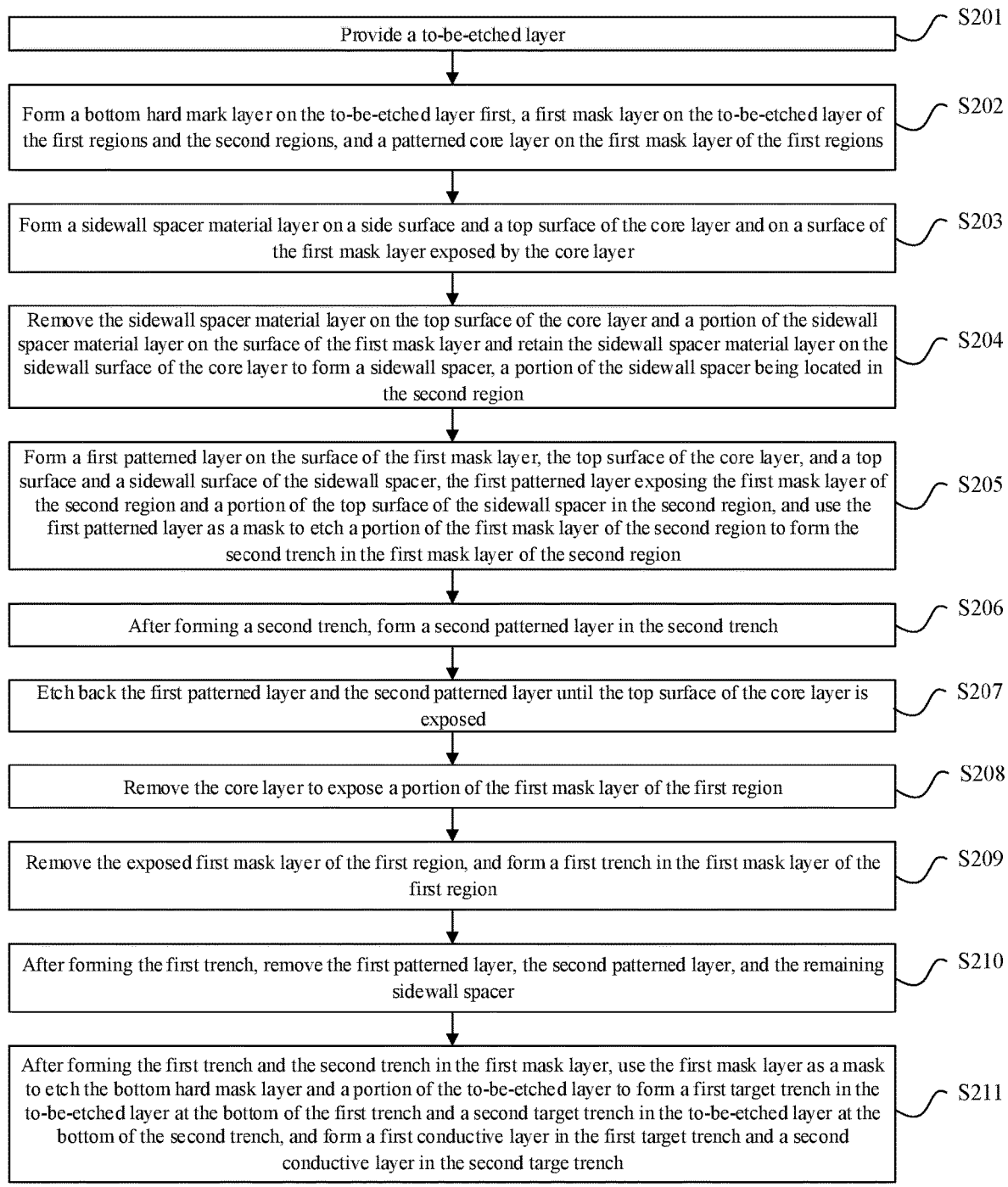
FIG. 39 illustrates an exemplary process for forming a semiconductor device consistent with the disclosed embodiments of the present disclosure.

FIG. 39 illustrates an exemplary process for forming a semiconductor device consistent with the disclosed embodiments of the present disclosure. FIGS. 6 to 26 illustrate schematics of semiconductor structures corresponding to certain stages of the exemplary process for forming a semiconductor device consistent with the disclosed embodiments of the present disclosure.

Figure 6:
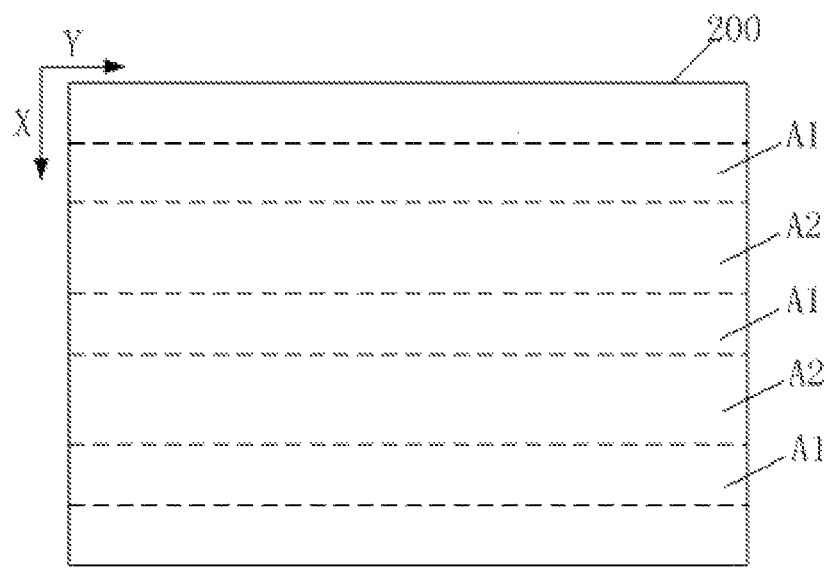
FIGS. 6 to 26 illustrate schematics of semiconductor structures corresponding to certain stages of an exemplary process for forming a semiconductor device consistent with the disclosed embodiments of the present disclosure.

As shown in FIG. 39, a to-be-etched layer is provided (S201). FIG. 6 illustrates a corresponding semiconductor structure.

Referring to FIG. 6, a to-be-etched layer 200 is provided. The to-be-etched layer 200 includes a plurality of first regions A1 and a plurality of second regions A2. The plurality of first regions A1 and the plurality of second regions A2 are arranged alternatively. A first region A1 of the plurality of first regions A1 adjoins a second region A2 of the plurality of second regions A2.

In some embodiments, if the plurality of first regions A1 and the plurality of second region A2 are alternatively arranged along the first direction X, only one second region A2 may exist between neighboring first regions A1, and only one first region A1 may exist between neighboring second regions A2.

In some embodiments, three first regions A1 and two second regions A2 are described as an example. In some other embodiments, any number of the first regions and any number of the second regions may be formed.

In some embodiments, a region not marked with the first region or the second region may be considered as another region that no first conductive layer or second conductive layer may be formed.

In some embodiments, the to-be-etched layer 200 may include a low K dielectric layer (e.g., K smaller than or equal to 3.9). In some other embodiments, a material of the to-be-etched layer 200 may include silicon oxide ($SiO_2$).

Figure 7:
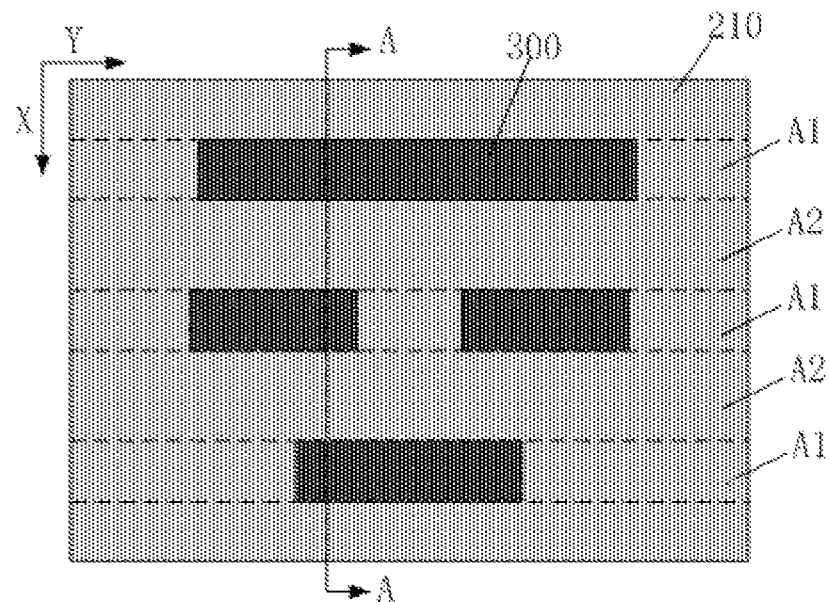
Figure 8:
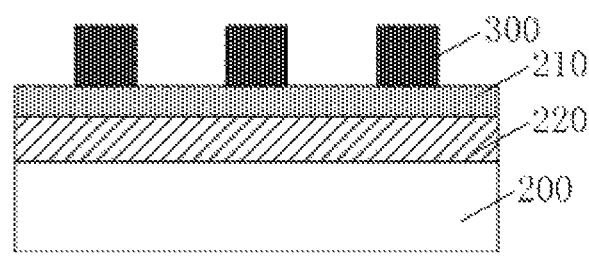

As shown in FIG. 39, a bottom hard mask layer is formed on the to-be-etched layer first, then a first mask layer is formed on the first regions and the second regions of the to-be-etched layer, and subsequently, a patterned core layer is formed on the first mask layer of the first regions (S202). FIG. 7 and FIG. 8 illustrate corresponding semiconductor structures.

FIG. 7 is a schematic diagram based on FIG. 6. FIG. 8 is a cross-region view of FIG. 7 along line A-A. A first mask layer 210 is formed on the first regions A1 and the second regions A2 of the to-be-etched layer 200.

In some embodiments, before the first mask layer 210 is formed, a bottom hard mask layer 220 is formed on the to-be-etched layer 200.

In some embodiments, the bottom hard mask layer 220 may contact the to-be-etched layer 200.

A material of the bottom hard mask layer 220 may include titanium nitride (TiN).

A material of the first mask layer 210 may include silicon oxide ($SiO_2$) or silicon nitride (SiN). In some embodiments, the material of the first mask layer 210 may include silicon oxide ($SiO_2$).

The bottom hard mask layer 220 may include the following functions. The bottom hard mask layer 220 may be used as an etching stop layer. The bottom hard mask layer 220 may be used as a stop layer for subsequently planarizing a conductive film. A material of the bottom hard mask layer 220 may include a hard mask material. Thus, when a first target trench and a second target trench are formed by etching, etching loss of the bottom hard mask layer 220 may be small, and pattern transfer may have high stability during the process of transferring the pattern in the bottom hard mask layer 220 to the to-be-etched layer.

Referring back to FIG. 7 and FIG. 8, after the first mask layer 210 is formed, a patterned core layer 300 is formed on the first mask layer 210 of the first regions A1.

In some embodiments, forming the patterned core layer 300 includes forming a core material layer on the first mask layer 210, forming a patterned photoresist layer on the core material layer, using the patterned photoresist layer as a mask to etch the core material layer until exposing a surface of the first mask layer 210 to form the patterned core layer 300, and removing the patterned photoresist layer. The patterned photoresist layer may define a position and dimension of the core layer to be formed.

A material of the core layer 300 may include polysilicon, amorphous carbon, an organic dielectric layer (ODL) material, a bottom anti-reflective coating (BARC) material, a dielectric anti-reflective coating (DARC) material, or a Si-ARC material.

In some embodiments, the material of the core layer 300 may include amorphous carbon.

In some embodiments, the dimension and position of the core layer 300 may correspond to the dimension and position of the first target trenches formed subsequently in the to-be-etched layer 200.

In some embodiments, a width of a portion of the core layer 300 along a first direction X may be same as a width of the first region A1 along the first direction X. In some other embodiments, the width of the portion of the core layer 300 along the first direction X may not be the same as the width of the first region A1 along the first direction X.

In some embodiments, two portions of the core layer 300 may be arranged on a same straight line along a second direction Y. An HTH between the two portions of the core layer 300 may be D1. The second direction Y may be perpendicular to the first direction X.

In some other embodiments, any number of the portions of the formed core layer 300 arranged along the second direction Y may be formed.

Figure 9:
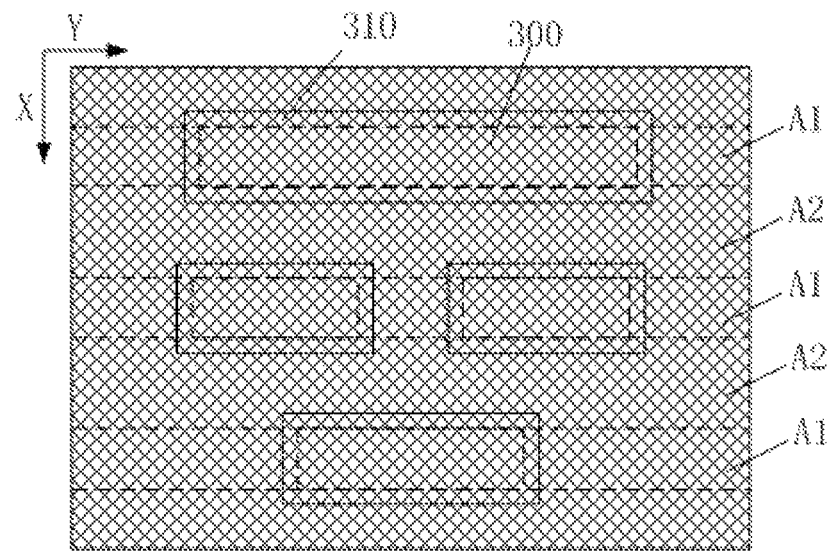
Figure 10:
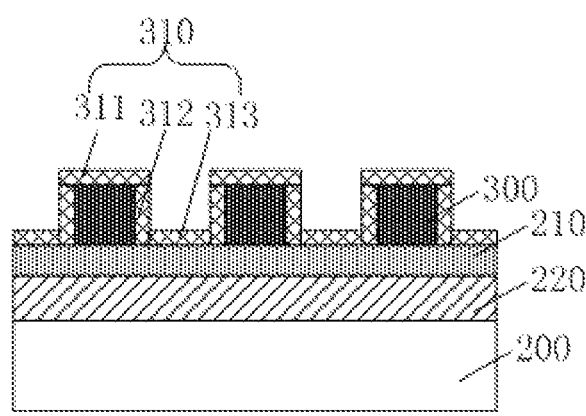

As shown in FIG. 39, a sidewall spacer material layer is formed on a sidewall surface and a top surface of the core layer and on a surface of the first mask layer exposed by the core layer (S203). FIG. 9 and FIG. 10 illustrate corresponding semiconductor structures.

FIG. 9 and FIG. 7 provide schematic views of structures of a same top view direction. FIG. 10 and FIG. 8 provide schematic views of structures of a same cross-section. A sidewall spacer material layer 310 is formed on a sidewall surface and a top surface of the core layer 300 and on a surface of the first mask layer 210 exposed by the core layer 300.

A material of the sidewall spacer material layer 310 may be different from the material of the core layer 300. Therefore, a subsequent process of removing the sidewall spacer material layer 310 or the core layer 300 may cause the core layer 300 or the sidewall spacer material layer 310 to have a larger etching selectivity ratio over the other. Moreover, the material of the sidewall spacer material layer 310 may be different from the material of the first mask layer 210. Therefore, the sidewall spacer material layer 310 may have a larger etching selectivity ratio over the first mask layer 210.

In some embodiments, the material of the sidewall spacer material layer 310 may include titanium oxide ($TiO_2$). In some other embodiments, the material of the sidewall spacer material layer 310 may include silicon oxide ($SiO_2$), silicon nitride (SiN), titanium nitride (TiN), aluminum nitride (AlN), or aluminum oxide ($Al_2O_3$).

The sidewall spacer material layer 310 may be formed by a chemical vapor deposition (CVD) process, a physical vapor deposition (PVD) process, or an atomic layer deposition (ALD) process. In some embodiments, the ALD process may be used to form the sidewall spacer material layer 310 to cause the formed sidewall spacer material layer 310 to have a great step covering ability.

In some embodiments, to facilitate subsequent description, the sidewall spacer material layer 310 includes a first sidewall spacer material layer 311 on the top surface of the core layer 300, a second sidewall spacer material layer 312 on the sidewall surface of the core layer 300, and a third sidewall spacer material layer 313 on the surface of the first mask layer 210.

In some embodiments, a width of the portion of the core layer 300 along the first direction X may be the same as the width of the first region A1 along the first direction X. A portion of the second sidewall spacer material layer 312 may be located in the second region A2.

After the sidewall spacer material layer 310 is formed, the first sidewall spacer material layer 311 and the third sidewall spacer material layer 313 may be subsequently removed, the first trench may be formed in the first mask layer of the first region, and the second trench may be formed in the first mask layer of the second region.

In some embodiments, the second trench may be formed in the first mask layer 210 of the second region A2 first, then the first trench may be formed in the first mask layer 210 of the first region A1.

In some embodiments, forming the second trench in the first mask layer 210 of the second region A2 includes the following processes.

Figure 11:
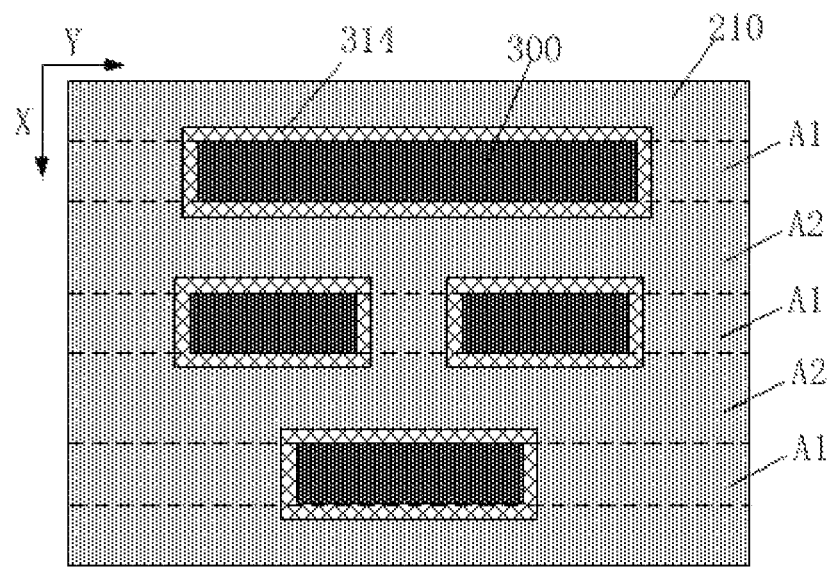
Figure 12:
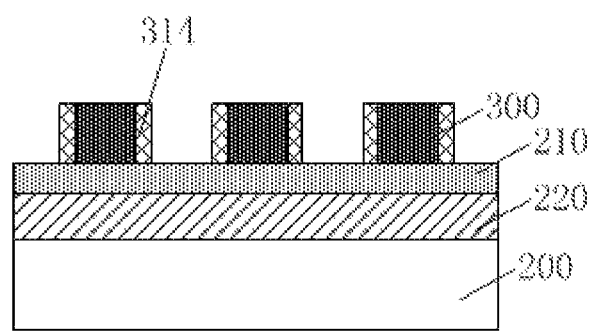

As shown in FIG. 39, the sidewall spacer material layer on the top surface of the core layer and a portion of the sidewall spacer material layer on the surface of the first mask layer is removed, and the sidewall spacer material layer on the sidewall surface of the core layer is retained to form a sidewall spacer. A portion of the sidewall spacer is located in the second region (S204). FIG. 11 and FIG. 12 illustrate the corresponding structures.

FIG. 11 and FIG. 9 provide schematic views of structures of the same top view direction. FIG. 12 and FIG. 10 provide schematic views of structures of the same cross-section. The sidewall spacer material layer on the top surface of the core layer 300 and the sidewall spacer material layer on the surface of the first mask layer 210 is removed. The sidewall spacer material layer on the sidewall surface of the core layer 300 is retained to form a sidewall spacer 314. A portion of the sidewall spacer 314 is located in the second region A2.

In some embodiments, the first sidewall spacer material layer 311 and the third sidewall spacer material layer 313 may be removed. The second sidewall spacer material layer 312 may be retained to form the sidewall spacer 314 on the sidewall surface of the core layer 300, and the surface of the first mask layer 210 of the second region A2 may be exposed.

In some embodiments, a non-mask etching process may be used to remove the first sidewall spacer material layer 311 and the third sidewall spacer material layer 313.

Figure 13:
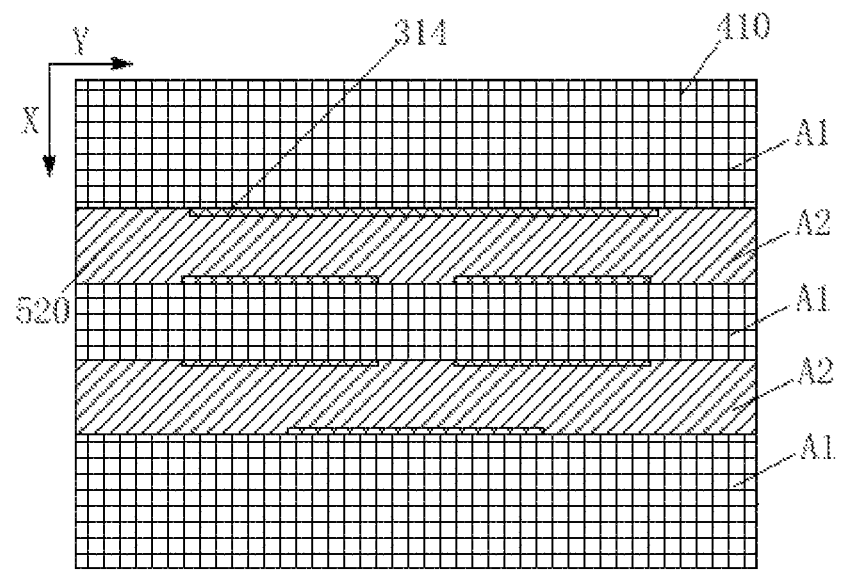
Figure 14:
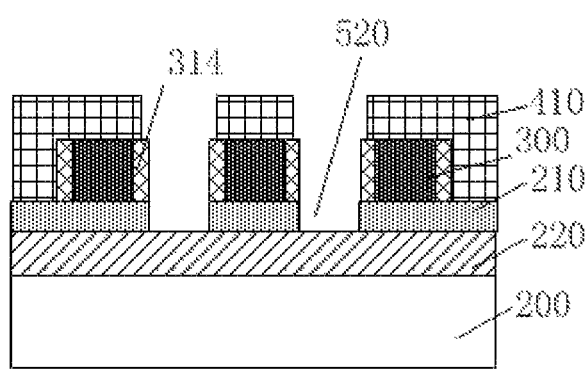

As shown in FIG. 39, a first patterned layer is formed on the surface of the first mask layer, the top surface of the core layer, and a top surface and a sidewall surface of the sidewall spacer. The first patterned layer exposes the first mask layer of the second region and a portion of the top surface of the sidewall spacer in the second region. The first patterned layer is used as a mask to etch and remove a portion of the first mask layer of the second region to form the second trench in the first mask layer of the second region (S205). FIG. 13 and FIG. 14 illustrate the corresponding structures.

FIG. 13 and FIG. 11 provide schematic views of structures of the same top view direction. FIG. 14 and FIG. 12 provide schematic views of structures of the same cross-section. A first patterned layer 410 is formed on the surface of the first mask layer 210, the top surface of the core layer 300, and a top surface and a sidewall surface of the sidewall 314. The first patterned layer 410 exposes the first mask layer 210 of the second region A2 and a portion of the top surface of the sidewall 314 in the second region A2.

In some embodiments, the sidewall spacer 314 may be used as an alignment reference for the second photolithography. The first patterned layer 410 may expose a portion of the top surface of the sidewall spacer 314 located in the second region A2. When the second trench is formed by etching the first mask layer 210 of the second region A2, the exposed sidewall spacer 314 may assist the alignment to realize the self-alignment in the etching process.

In some embodiments, a material of the first patterned layer 410 may include an organic dielectric material.

Referring back to FIG. 13 and FIG. 14, the first patterned layer 410 is used as a mask to etch and remove a portion of the first mask layer 210 of the second region A2 and form the second trench 520 in the first mask layer 210 of the second region A2.

In some embodiments, a dry etching process is used to remove the portion of the first mask layer 210 of the second region A2.

In some other embodiments, a wet etching process or a dry-wet combined etching process may also be used to remove the first mask layer 210.

Figure 15:
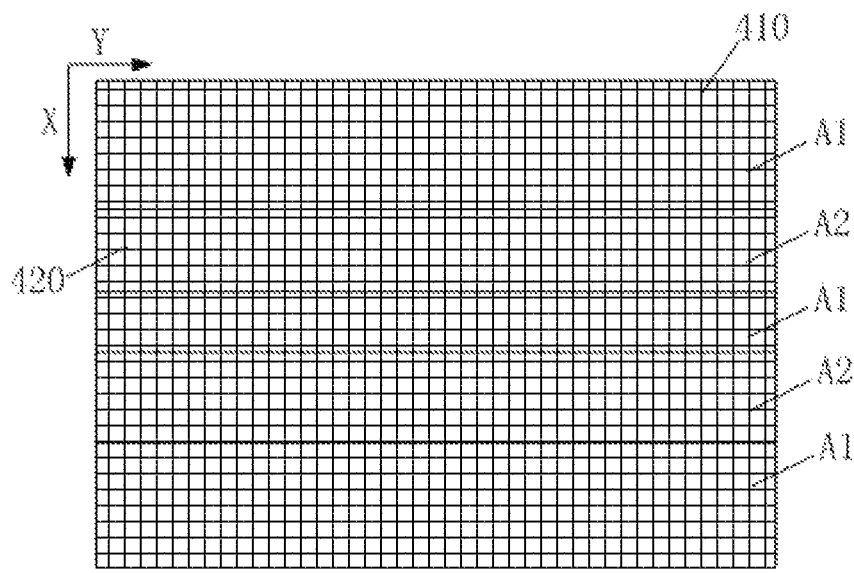
Figure 16:
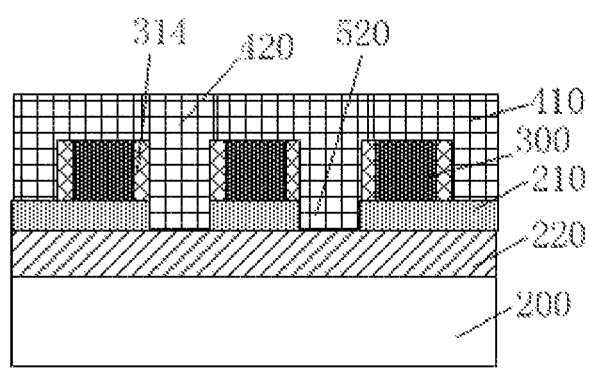

As shown in FIG. 39, after a second trench is formed, a second patterned layer is formed in the second trench. The second patterned layer covers the to-be-etched layer of the second region and a portion of a top surface and a sidewall surface of the sidewall spacer of the second region, and the top surface of the second patterned layer is coplanar with the top surface of the first patterned layer (S206). FIG. 15 and FIG. 16 illustrate the corresponding structures.

FIG. 15 and FIG. 13 provide schematic views of structures of the same top view direction. FIG. 16 and FIG. 14 provide schematic views of structures of the same cross-section. After a second trench 520 is formed, a second patterned layer 420 is formed in the second trench. The second patterned layer 420 covers the to-be-etched layer 200 of the second region A2 and a portion of a top surface and a sidewall surface of the sidewall spacer 314 of the second region A2, and the top surface of the second patterned layer 420 is planar with the top surface of the first patterned layer 410.

In some embodiments, since a bottom hard mask layer 220 may be formed between the to-be-etched layer 200 and the first mask layer 210, the second patterned layer 420 may cover the surface of the bottom hard mask layer 220. Moreover, since the first patterned layer 410 exposes a portion of the top surface of the sidewall spacer 314 located in the second region A2, the second patterned layer 420 may cover the portion of the top surface and the sidewall surface of the sidewall 314 exposed by the first patterned layer 410.

In some embodiments, the material of the second patterned layer 420 may be the same as the material of the first patterned layer 410, which includes the organic dielectric material.

The first patterned layer 410 and the second patterned layer 420 are both used to protect the first mask layer 210 and the bottom hard mask layer 220 from being damaged during the subsequent process of removing the core layer 300.

Figure 17:
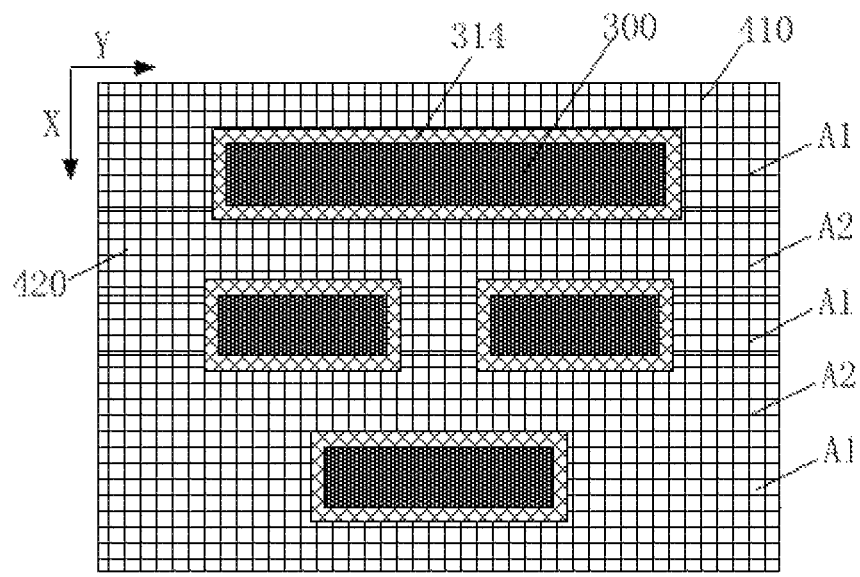
Figure 18:
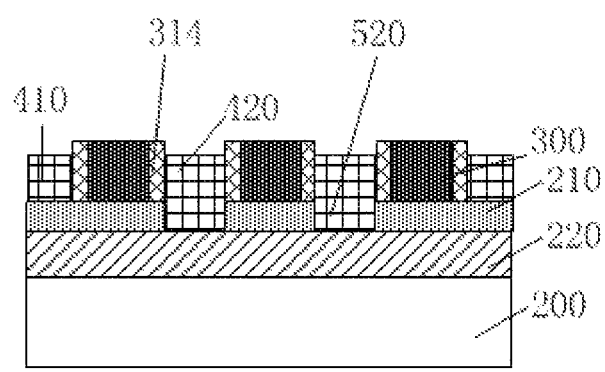

As shown in FIG. 39, the first patterned layer and the second patterned layer are etched back until the top surface of the core layer is exposed (S207). FIG. 17 and FIG. 18 illustrate the corresponding structures.

FIG. 17 and FIG. 15 provide schematic views of structures of the same top view direction. FIG. 18 and FIG. 16 provide schematic views of structures of the same cross-section. The first patterned layer 410 and the second patterned layer 420 are etched back until the top surface of the core layer 300 is exposed.

In some embodiments, after being etched back, the top surfaces of the first patterned layer 410 and the second patterned layer 420 may be lower than the top surface of the core layer 300.

In some embodiments, etching back the first patterned layer 410 and the second patterned layer 420 may include a dry etching.

Figure 19:
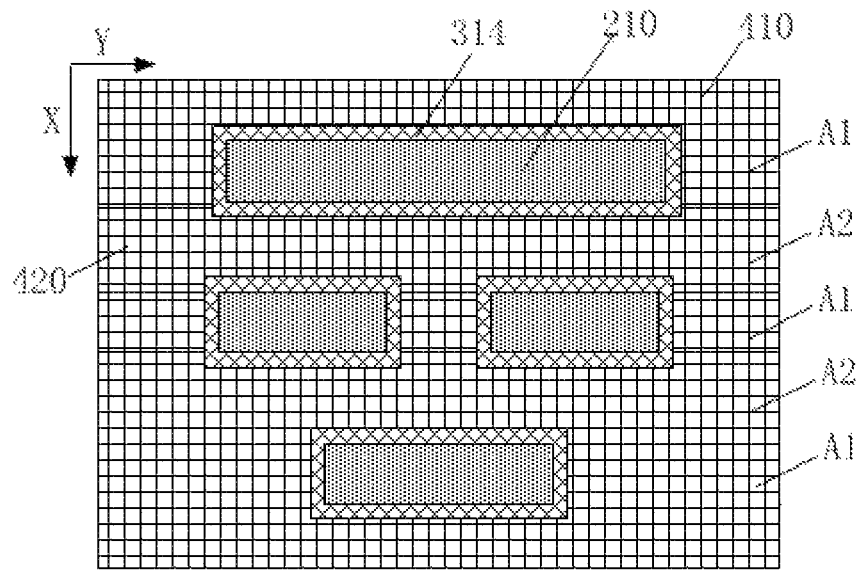
Figure 20:
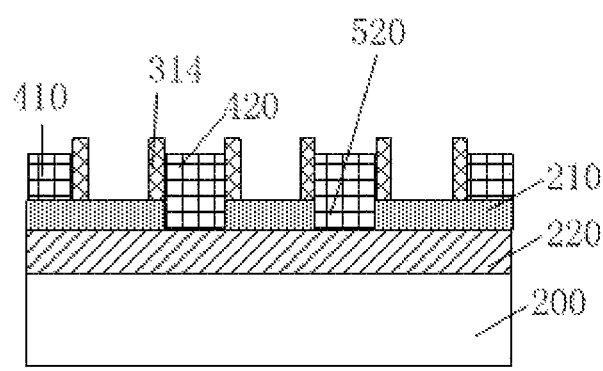

As shown in FIG. 39, the core layer is removed to expose a portion of the first mask layer of the first region (S208). FIG. 19 and FIG. 20 illustrate the corresponding structure.

FIG. 19 and FIG. 17 provide schematic views of structures of the same top view direction. FIG. 20 and FIG. 18 provide schematic views of structures of the same cross-section. The core layer 300 is removed to expose a portion of the first mask layer 210 of the first region A1.

In some embodiments, removing the core layer 300 may include a dry etching.

In some other embodiments, removing the core layer 300 may further include a wet etching.

Figure 21:
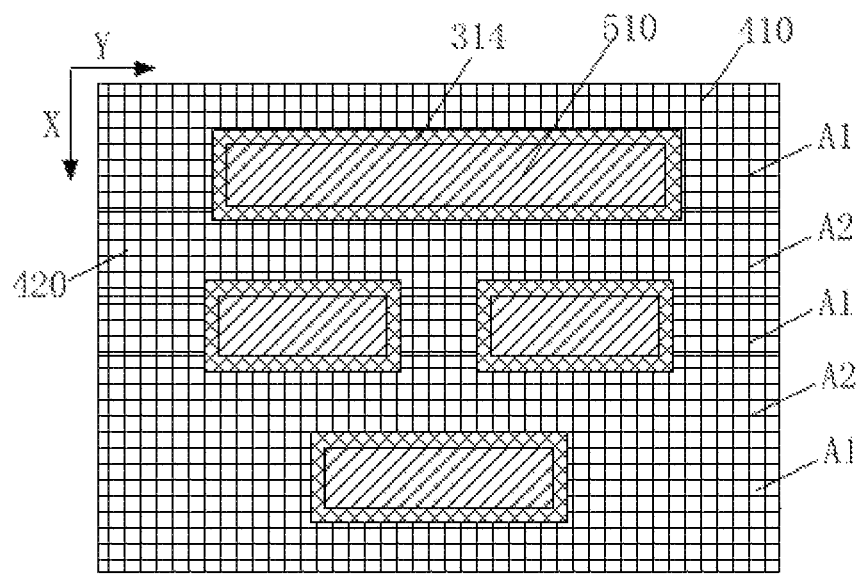
Figure 22:
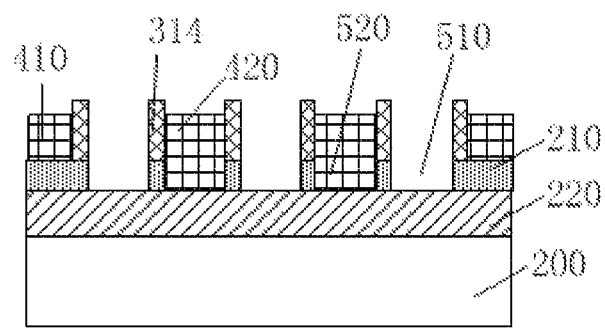

As shown in FIG. 39, the exposed first mask layer of the first region is removed, and a first trench is formed in the first mask layer of the first region (S209). FIG. 21 and FIG. 22 illustrate the corresponding structure.

FIG. 21 and FIG. 19 provide schematic views of structures of the same top view direction. FIG. 22 and FIG. 21 provide schematic views of structures of the same cross-section. The exposed first mask layer 210 of the first region A1 is removed, and a first trench 510 is formed in the first mask layer 210 of the first region A1.

In some embodiments, removing the exposed first mask layer 210 of the first region A1 may include a dry etching.

In some other embodiment, removing the exposed first mask layer 210 of the first region A1 may include a wet etching or a combination of the dry etching and the wet etching.

In some embodiments, during the process of forming the first trench 510, the patterned core layer 300 may be formed on the first mask layer 210 of the first region A1. The patterned core layer 300 may define the position and the dimension of the to-be-formed first trench. Then, the sidewall spacer 314 used as the alignment reference for the subsequent second photolithography may be formed on the sidewall surface of the patterned core layer 300. The sidewall spacer 314 may not be formed in the first trench 510.

When the topography of the first trench 510 is subsequently transferred to the to-be-etched layer 200 to form the first target trench, the dimension of the first target trench is the same as that of the first trench. When a first conductive layer is formed by filling metal in the first target trench, the HTH of the neighboring first conductive layers, that is the dimension of the HTH, may not be affected by the sidewall spacer 314. Therefore, the dimension of the HTH may be further reduced, and the dimension of the HTH distance of the first conductive layers is the same as the dimension of the HTH of the first trench, which may match the expected dimension of the HTH.

Figure 23:
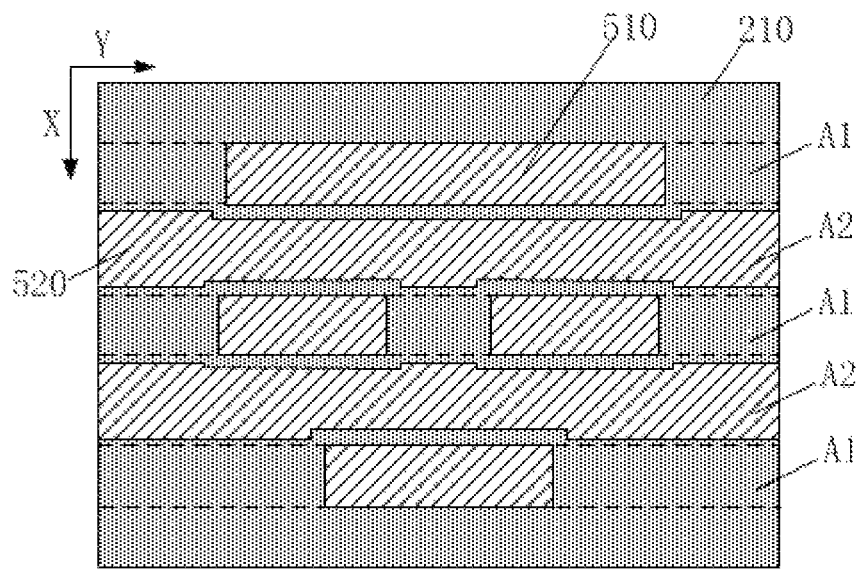
Figure 24:
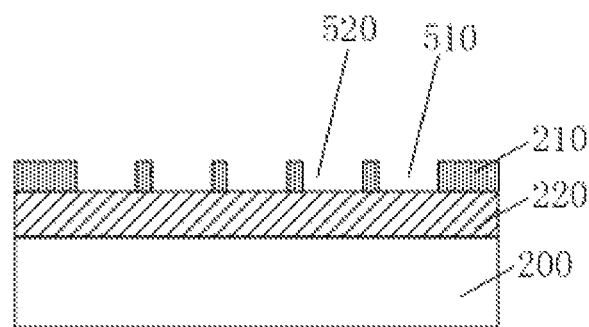

As shown in FIG. 39, after the first trench is formed, the first patterned layer, the second patterned layer, and the remaining sidewall spacer are removed (S210). FIG. 23 and FIG. 24 illustrate the corresponding structure.

FIG. 23 and FIG. 21 provide schematic views of structures of the same top view direction. FIG. 24 and FIG. 22 provide schematic views of structures of the same cross-section. After the first trench 510 is formed, the first patterned layer 410, the second patterned layer 420, and the remaining sidewall spacer 314 are removed.

In some embodiments, removing the first patterned layer 410 and the second patterned layer 420 may include at least one of a dry etching or a wet etching.

In some embodiments, removing the sidewall spacer 314 may include at least one of the dry etching or the wet etching.

Figure 25:
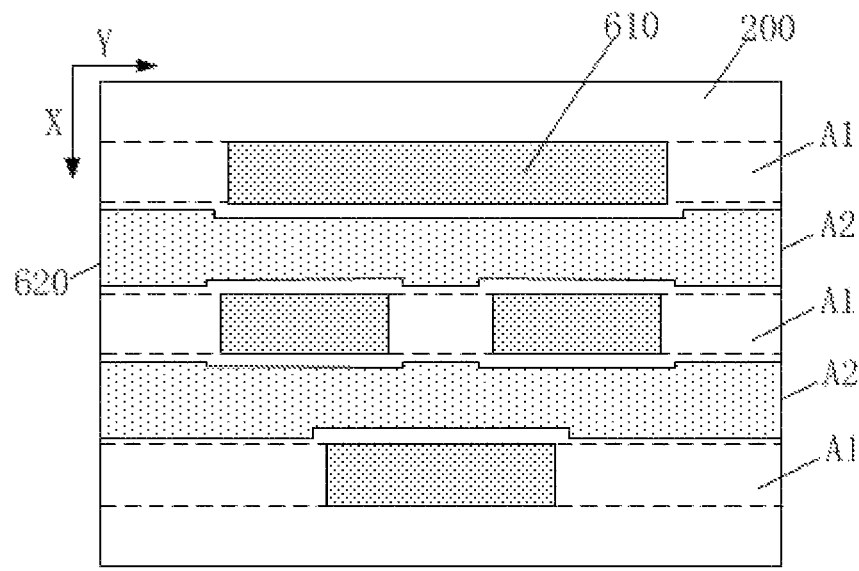
Figure 26:
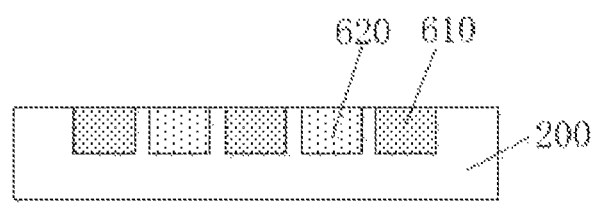

As shown in FIG. 39, after the first trench and the second trench are formed in the first mask layer, the first mask layer is used as a mask to etch the bottom hard mask layer and a portion of the to-be-etched layer to form a first target trench in the to-be-etched layer at the bottom of the first trench and a second target trench in the to-be-etched layer at the bottom of the second trench. A first conductive layer is formed in the first target trench, and a second conductive layer is formed in the second target trench. (S211). FIG. 25 and FIG. 26 illustrate the corresponding structures.

FIG. 25 and FIG. 23 provide schematic views of structures of the same top view direction. FIG. 26 and FIG. 24 provide schematic views of structures of the same cross-section. After the first trench 510 and the second trench 520 are formed in the first mask layer 210, the first mask layer 210 is used as a mask to etch the bottom hard mask layer 220 and a portion of the to-be-etched layer 200 to form a first target trench in the to-be-etched layer 200 at the bottom of the first trench 510 and a second target trench in the to-be-etched layer 200 at the bottom of the second trench 520.

Using the first mask layer 210 the mask to etch the bottom hard mask layer 220 and the portion of the to-be-etched 200 may include at least one of a dry etching or a wet etching.

In some embodiments, after the first target trench and the second target trench are formed, the first mask layer 210 may be removed. In some other embodiments, the first mask layer may not be removed first, which may be removed until when the first conductive layer and the second conductive layer are subsequently formed.

In some embodiments, the method may also include forming a first conductive layer 610 in the first target trench and forming a second conductive layer 620 in the second target trench.

The method for forming the first conductive layer may include forming a first conductive film on the surface of the bottom hard mask layer 220 in the first target trench. The first conductive film may fill up the first target trench and cover the surface of the bottom hard mask layer 220. The method may further include planarizing the first conductive film and the bottom hard mask layer 220 until the to-be-etched layer 200 is exposed and a first conductive layer 610 is formed in the first target trench.

A material of the first conductive film may include metal. Correspondingly, a material of the first conductive layer may include a metal. In some embodiments, the material of the conductive layer may include copper. In some other embodiments, the material of the conductive layer may include aluminum, tungsten, or cobalt.

Forming the first conductive film may include a CVD or a PVD process.

A material and formation method of the second conductive layer may be the same as the material and formation method of the first conductive layer and are not be repeated here.

Figure 40:
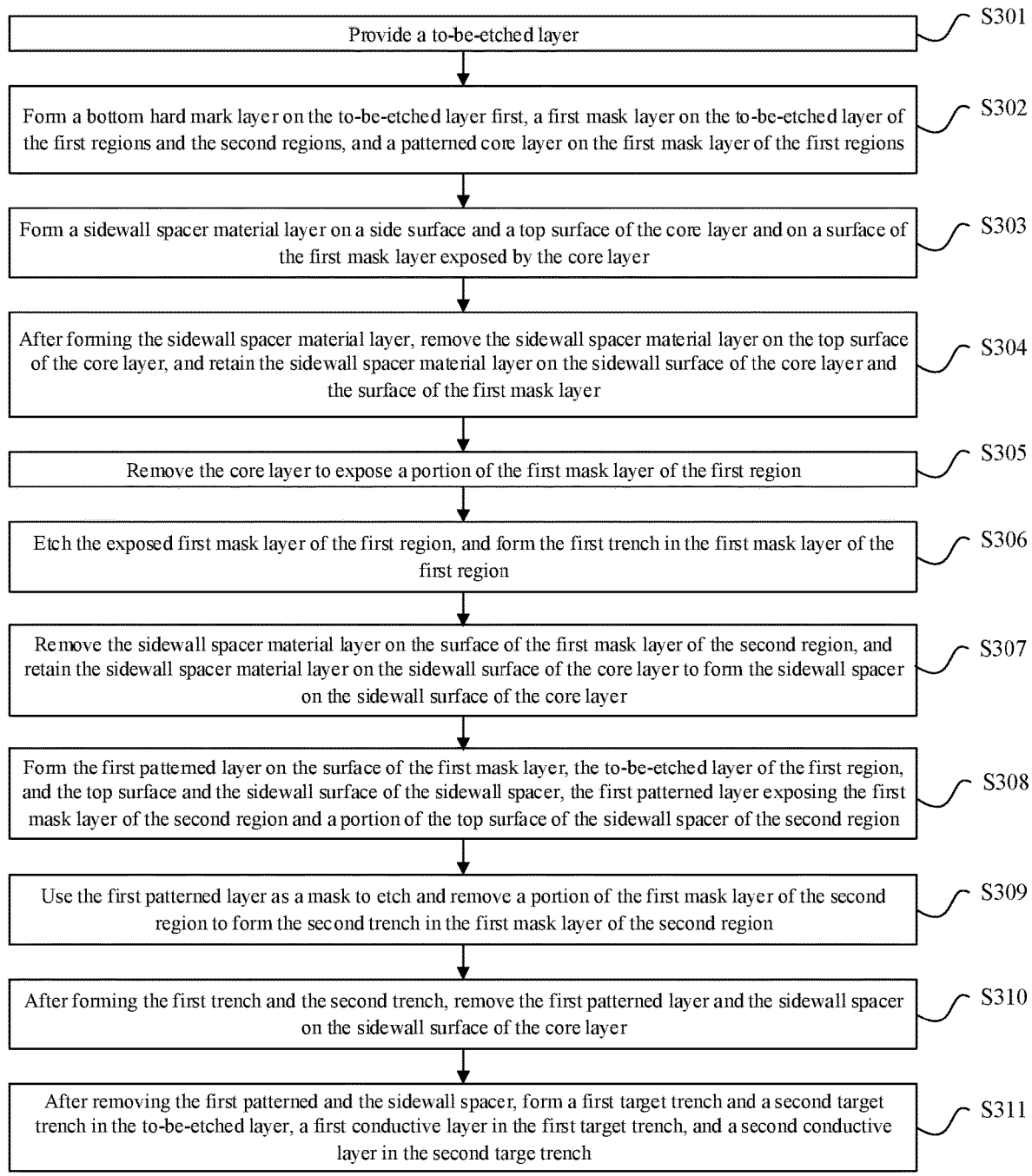
FIG. 40 illustrates an exemplary process for forming a semiconductor device consistent with the disclosed embodiments of the present disclosure.

FIG. 40 illustrates an exemplary process for forming a semiconductor device consistent with the disclosed embodiments of the present disclosure. FIGS. 27 to 38 illustrate schematics of semiconductor structures corresponding to certain stages of the exemplary process for forming a semiconductor device consistent with the disclosed embodiments of the present disclosure.

In some embodiments, a difference between the present method and the above-described method is that the first trench is formed in the first mask layer of the first region first, then the second trench is formed in the first mask layer of the second region.

As shown in FIG. 40, a to-be-etched layer is provided (S301). A bottom hard mark layer is formed on the to-be-etched layer first, then a first mask layer is formed on the to-be-etched layer of the first regions and the second regions, and subsequently, a patterned core layer is formed on the first mask layer of the first regions (S302). A sidewall spacer material layer is formed on a sidewall surface and a top surface of the core layer and on a surface of the first mask layer exposed by the core layer (S303). FIGS. 6-10 illustrate the corresponding structures.

The material and formation method of the to-be-etched layer 200, the bottom hard mask layer 220, the first mask layer 210, the patterned core layer 300, and the sidewall spacer material layer 310 are the same as those described above, which is not repeated here.

Figure 27:
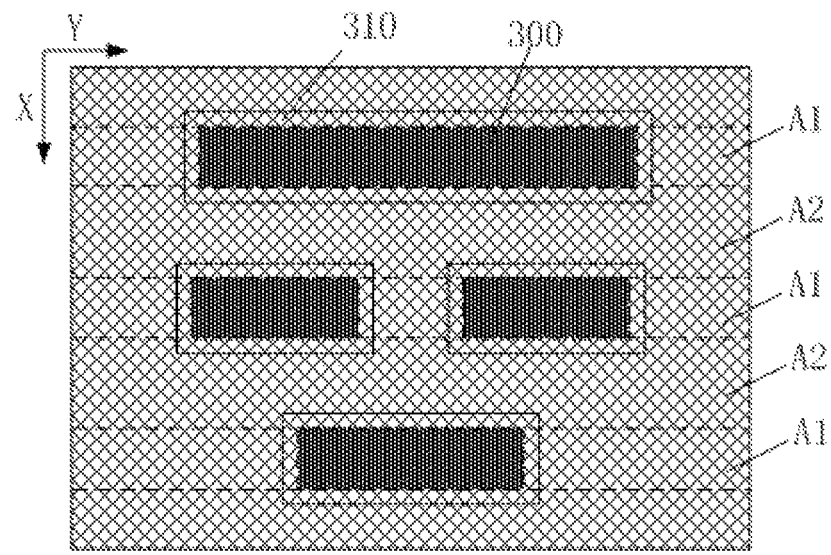
FIGS. 27 to 38 illustrate schematics of semiconductor structures corresponding to certain stages of an exemplary process for forming a semiconductor device consistent with the disclosed embodiments of the present disclosure.
Figure 28:
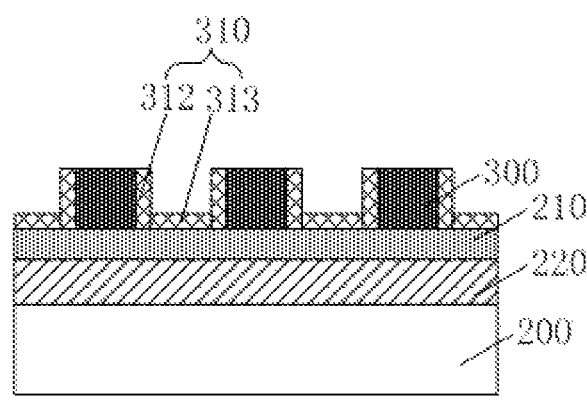

As shown in FIG. 40, after the sidewall spacer material layer is formed, the sidewall spacer material layer on the top surface of the core layer is removed, and the sidewall spacer material layer on the sidewall surface of the core layer and the surface of the first mask layer is retained (S304). FIG. 27 and FIG. 28 illustrate the corresponding structures.

FIG. 27 and FIG. 25 provide schematic views of structures of the same top view direction. FIG. 28 and FIG. 26 provide schematic views of structures of the same cross-section. After the sidewall spacer material layer 310 is formed, the sidewall spacer material layer 310 on the top surface of the core layer 300 is removed, and the sidewall spacer material layer 310 on the sidewall surface of the core layer 300 and the surface of the first mask layer 210 is retained.

In some embodiments, the first sidewall spacer material layer 311 is removed, and the second sidewall spacer material layer 312 and the third sidewall spacer 313 are retained. After removing the first sidewall spacer material layer 311, the top surface of the core layer 300 is exposed to facilitate subsequent removal of the core layer 300.

Figure 29:
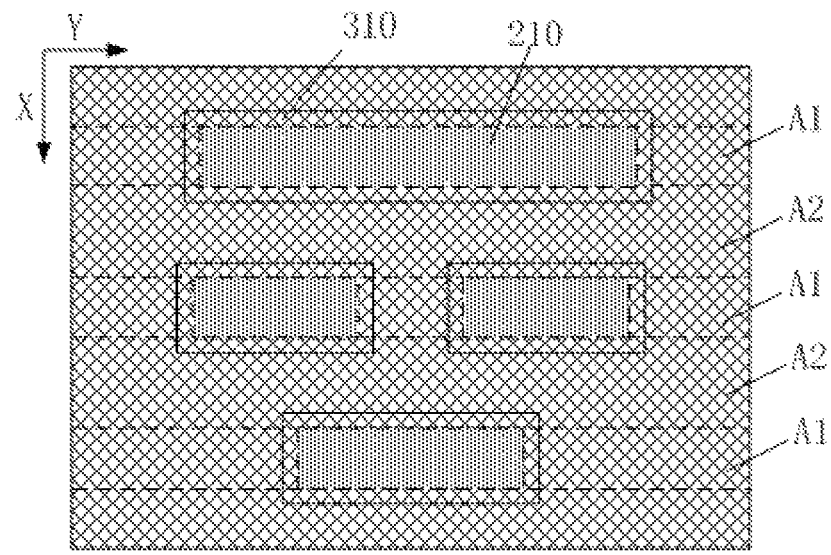
Figure 30:
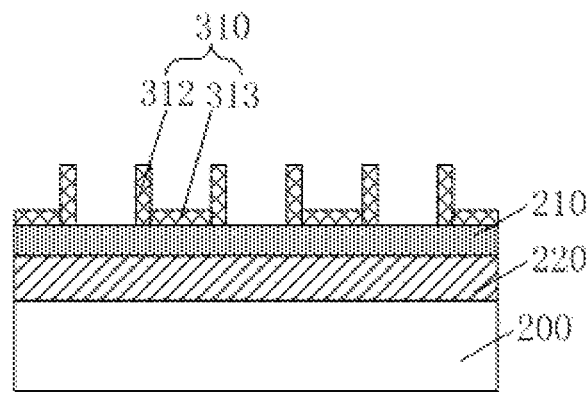

As shown in FIG. 40, the core layer is removed to expose a portion of the first mask layer of the first region (S305). FIG. 29 and FIG. 30 illustrate the corresponding structures.

FIG. 29 and FIG. 27 provide schematic views of structures of the same top view direction. FIG. 30 and FIG. 28 provide schematic views of structures of the same cross-section. The core layer 300 is removed to expose a portion of the first mask layer 210 of the first region A1.

In some embodiments, the method of removing the core layer 300 may be the same as described above, which is not repeated here.

Figure 31:
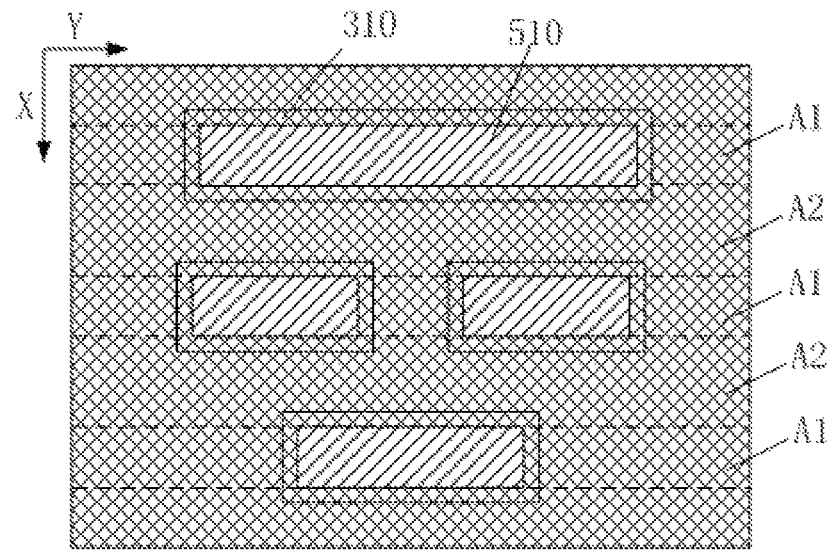
Figure 32:
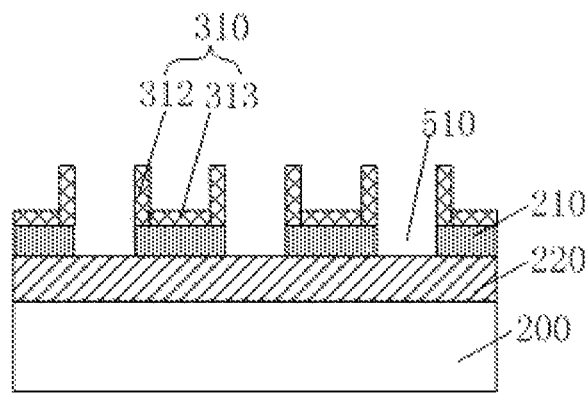

As shown in FIG. 40, the exposed first mask layer of the first region is etched and removed, and the first trench is formed in the first mask layer of the first region (S306). FIG. 31 and FIG. 32 illustrate the corresponding structures.

FIG. 31 and FIG. 29 provide schematic views of structures of the same top view direction. FIG. 32 and FIG. 30 provide schematic views of structures of the same cross-section. The exposed first mask layer 210 of the first region A1 is etched and removed, and the first trench 510 is formed in the first mask layer 210 of the first region A1.

In some embodiments, since the bottom hard mask layer 220 is formed on the to-be-etched layer 200, the surface of the bottom hard mask layer 220 may be exposed at the bottom of the first trench 510.

In some embodiments, the method of etching and removing the first mask layer 210 may be the same as described above, which is not repeated here.

After the first trench 510 is formed, the second trench 520 may be formed in the first mask layer 210 of the second region A2.

Figure 33:
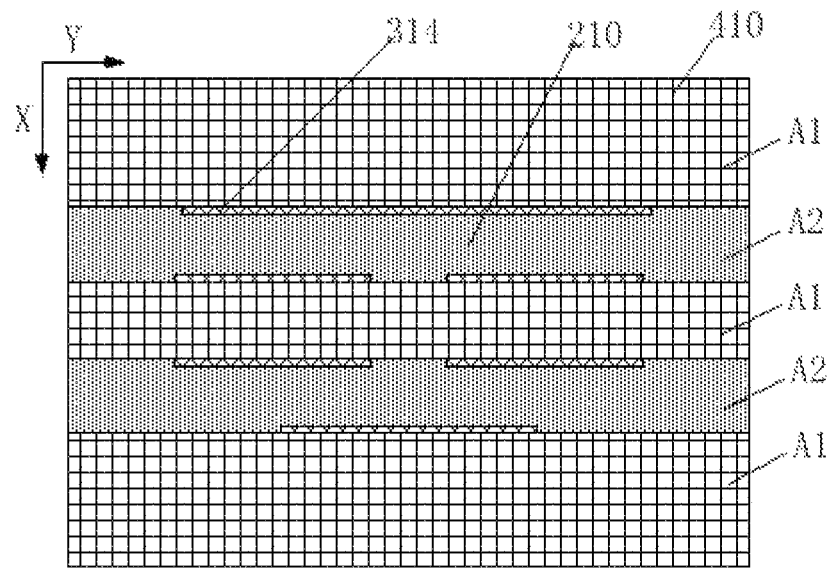
Figure 34:
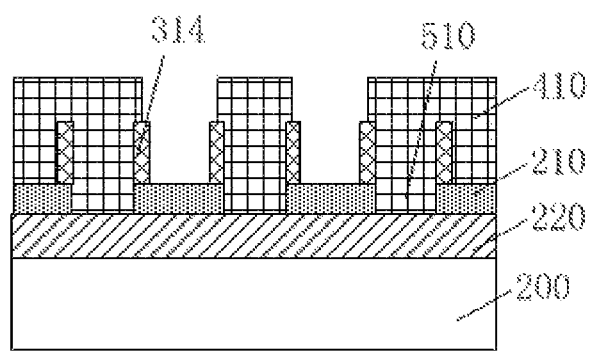

As shown in FIG. 40, the sidewall spacer material layer on the surface of the first mask layer of the second region is removed, and the sidewall spacer material layer on the sidewall surface of the core layer is retained to form the sidewall spacer on the sidewall surface of the core layer (S307). FIG. 33 and FIG. 34 illustrate the corresponding structures.

FIG. 33 and FIG. 31 provide schematic views of structures of the same top view direction. FIG. 34 and FIG. 32 provide schematic views of structures of the same cross-section. The sidewall spacer material layer 310 on the surface of the first mask layer 210 of the second region A2 is removed, and the sidewall spacer material layer 310 on the sidewall surface of the core layer 300 is remained to form the sidewall spacer 314 on the sidewall surface of the core layer.

In some embodiments, the third sidewall spacer material layer 313 may be removed, and the second sidewall spacer material layer 312 may remain. Since the width of the core layer 300 along the first direction X is the same as the width of the first region A1 along the first direction X, a portion of the sidewall spacer 314 may be located in the second region A2.

In some embodiments, after the first mask layer 210 of the first region A1 is removed, the third sidewall spacer material layer 313 is removed. As such, the first mask layer 210 of the second region A2 may be prevented from being damaged.

As shown in FIG. 40, the first patterned layer is formed on the surface of the first mask layer, the to-be-etched layer of the first region, and the top surface and the sidewall surface of the sidewall spacer, and the first patterned layer exposes the first mask layer of the second region and a portion of the top surface of the sidewall spacer of the second region (S308). FIG. 33 and FIG. 34 illustrate the corresponding structures.

Referring back to FIG. 33 and FIG. 34, the first patterned layer 410 is formed on the surface of the first mask layer 210, the to-be-etched layer 200 of the first region A1, and a portion of the top surface and the sidewall surface of the sidewall spacer 314. The first patterned layer 410 exposes the first mask layer 210 of the second region A2 and a portion of the top surface of the sidewall spacer 314 of the second region A2.

The first patterned layer 410 may expose the portion of the top surface of the sidewall spacer 314 of the second region A2. The exposed sidewall spacer 314 may be used as an alignment reference to help to achieve the self-alignment when the first mask layer 210 of the second region A2 is subsequently etched.

In some embodiments, the material of the first patterned layer 410 may be the same as described above and is not be repeated here.

In some embodiments, since the bottom hard mask layer 220 is formed between the to-be-etched layer 200 and the first mask layer 210, the first patterned layer 410 may be formed on the surface of the bottom hard mask layer 220 of the first region A1.

Figure 35:
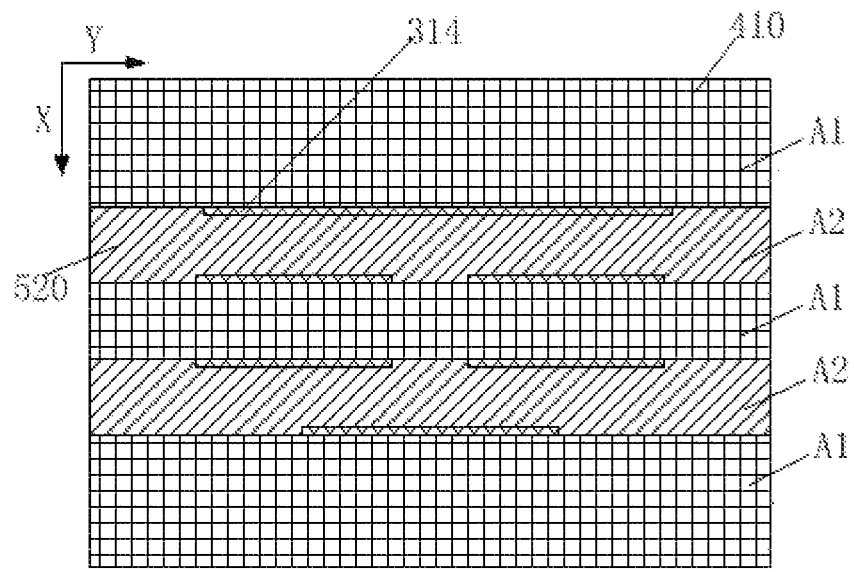
Figure 36:
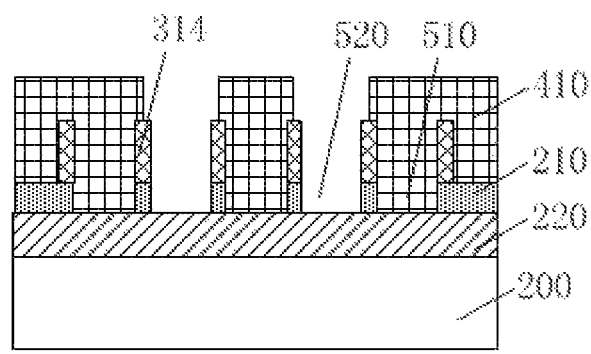

As shown in FIG. 40, the first patterned layer is used as a mask to etch and remove a portion of the first mask layer of the second region to form the second trench in the first mask layer of the second region (S309). FIG. 35 and FIG. 36 illustrate the corresponding structures.

FIG. 35 and FIG. 33 provide schematic views of structures of the same top view direction. FIG. 36 and FIG. 34 provide schematic views of structures of the same cross-section. The first patterned layer 410 is used as a mask to etch and remove a portion of the first mask layer 210 of the second region A2 to form the second trench 520 in the first mask layer 210 of the second region A2.

In some embodiments, the method of removing the first mask layer 210 of the second region A2 may be the same as described above and is not repeated here.

In some embodiments, before the first trench 510 and the second trench 520 are formed, the core layer 300 and the sidewall spacer material layer 310 on the surface of the core layer 300 and the surface of the first mask layer 210 may be formed. As such, the sidewall spacer may be prevented from being formed in the first trench 510 to affect the dimension of the HTH of the first conductive layers formed subsequently.

In some embodiments, the first trench 510 may be formed first, then the second trench 520 may be formed. Thus, the process of forming the second patterned layer and etching back the first patterned layer and the second patterned layer may be eliminated to simplify process flow.

Figure 37:
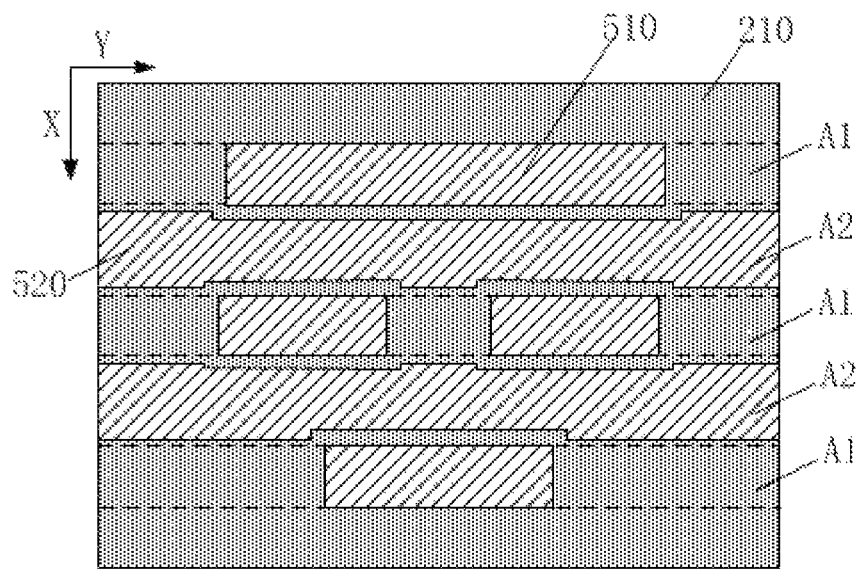
Figure 38:
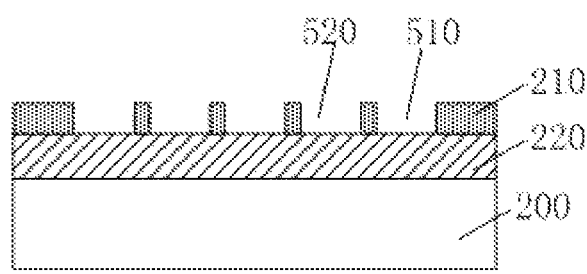

As shown in FIG. 40, after the first trench and the second trench are formed, the first patterned layer and the sidewall spacer on the sidewall surface of the core layer are removed (S310). FIG. 37 and FIG. 38 illustrate the corresponding structures.

FIG. 37 and FIG. 35 provide schematic views of structures of the same top view direction. FIG. 38 and FIG. 36 provide schematic views of structures of the same cross-section. After the first trench 510 and the second trench 520 are formed, the first patterned layer 410 and the sidewall spacer 314 on the sidewall surface of the core layer 300 are removed.

In some embodiments, the method of removing the first patterned layer 410 and the sidewall spacer 314 may be the same as described above and is not repeated here.

As shown in FIG. 40, after the first patterned layer and the sidewall spacer are removed, a first target trench and a second target trench are formed in the to-be-etched layer, a first conductive layer is formed in the first target trench, and a second conductive layer is formed in the second target trench (S311). FIG. 25 and FIG. 26 illustrate the corresponding structures.

In some embodiments, after the first patterned layer 410 and the sidewall spacer 314 are removed, a first target trench and a second target trench may be formed in the to-be-etched layer 200, and a first conductive layer may be formed in the first target trench. The method of forming the second conductive layer in the second target trench may be the same as described above and is not repeated here.

The materials of the first conductive layer and the second conductive layer may be the same as described above and are not repeated here.

As disclosed, the technical solutions of the present disclosure have the following advantages.

Before the first trench and the second trench are formed in the first mask layer, the patterned core layer is formed on the mask layer first. The patterned core layer defines the position and dimension of the to-be-formed first trench. Then, the sidewall spacer material layer is formed at the sidewall surface and the top surface of the core layer, and the surface of the first mask layer. Since the sidewall spacer material layer is formed before the first trench is formed and is located outside of the to-be-formed first trench, when the first trench is subsequently formed, the pattern of the first trench is the same as the pattern of the core layer. When the pattern of the first trench in the first mask layer is transferred to the to-be-etched layer, the impact of the sidewall spacer layer is avoided to cause the formed pattern of the first target trench to be consistent with the first trench. Moreover, when the first conductive layer is formed in the first target trench, the HTH between the neighboring first conductive layers is the HTH of the first trench, which is not affected by the sidewall spacer material layer. Thus, a smaller HTH may be obtained.

Although the present disclosure is disclosed as above, the present disclosure is not limited to this. Those skilled in the art may make various changes and modifications without departing from the spirit and scope of the present disclosure. Therefore, the scope of the present invention shall be subject to the scope defined by the claims.

What is claimed is:

1. A method for forming a semiconductor device, comprising:
providing a to-be-etched layer including a plurality of first regions and a plurality of second regions, the plurality of first regions and the plurality of second regions being alternatively arranged, and a first region of the plurality of first regions adjoins a corresponding second region of the plurality of second regions;
forming a first mask layer on the to-be-etched layer;
forming a patterned core layer on the first mask layer of the first region;
forming a sidewall spacer material layer on a top surface and a sidewall surface of the core layer and a surface of the first mask layer;
removing the sidewall spacer material layer on the top surface of the patterned core layer;
removing the patterned core layer and the first mask layer at a bottom of the patterned core layer to form a first trench in the first mask layer of the first region;
removing the sidewall spacer material layer on the surface of the first mask layer of a second region;
forming a first patterned layer exposing the first mask layer of the second region; and
using the first patterned layer as a mask to remove the first mask layer of the second region to form a second trench in the first mask layer of the second region.

2. The method according to claim 1, wherein after the second trench is formed in the first mask layer of the second region, the first trench is formed in the first mask layer of the first region.

3. The method according to claim 2, wherein forming the second trench in the first mask layer of the second region includes:
removing the sidewall spacer material layer on the top surface of the core layer and the surface of the first mask layer and keeping the sidewall spacer material layer on the sidewall surface of the core layer to form a sidewall spacer, a portion of the sidewall spacer being located in the second region;
forming the first patterned layer on the surface of the first mask layer, the top surface of the core layer, and a top surface and a sidewall surface of the sidewall spacer, the first patterned layer exposing the first mask layer of the second region and a portion of the top surface of the sidewall spacer of the second region; and
using the first patterned layer as a mask to etch and remove the first mask layer to form the second trench in the first mask layer of the second region.

4. The method according to claim 3, wherein forming the first trench in the first mask layer of the first region includes:
forming a second patterned layer in the second trench, the second patterned layer covering the to-be-etched layer of the second region and the top surface and sidewall surface of the sidewall spacer of the second region, and a top surface of the second patterned layer being coplanar with a top surface of the first patterned layer;
etching back the first patterned layer and the second patterned layer until the top surface of the core layer is exposed;
removing the core layer to expose a portion of the first mask layer of the first region; and
etching and removing the exposed first mask layer of the first region to form the first trench in the first mask layer of the first region.

5. The method according to claim 4, wherein a material of the second patterned layer and a material of the first patterned layer are the same and include an organic dielectric material.

6. The method according to claim 1, wherein after the first trench is formed in the first mask layer of the first region, the second trench is formed in the first mask layer of the second region.

7. The method according to claim 6, wherein forming the first trench in the first mask layer of the first region includes:
removing the sidewall spacer material layer on the top surface of the core layer and keeping the sidewall spacer material layer on the sidewall surface of the core layer and the surface of the first mask layer;
removing the core layer to expose a portion of the first mask layer of the first region; and
etching and removing the exposed portion of the first mask layer of the first region to form the first trench in the first mask layer of the first region.

8. The method according to claim 7, wherein forming the second trench in the first mask layer of the second region includes:
removing the sidewall spacer material layer on the surface of the first mask layer of the second region and keeping the sidewall spacer material layer on the sidewall surface of the core layer to form the sidewall spacer, a portion of the sidewall spacer being located in the second region;

forming the first patterned layer on the surface of the first mask layer, on the to-be-etched layer of the first region, and a top surface and a sidewall surface of the sidewall spacer, the first patterned layer exposing the first mask layer of the second region and a portion of the top surface of the sidewall spacer located in the second region; and using the first patterned layer as a mask to etch and remove a portion of the first mask layer of the second region to form the second trench in the first mask layer of the second region.

9. The method according to claim 8, wherein a material of the first patterned layer includes an organic dielectric material.

10. The method according to claim 1, wherein a material of the sidewall spacer material layer includes silicon oxide ($SiO_2$), silicon nitride (SiN), titanium oxide ($TiO_2$), titanium nitride (TiN), aluminum nitride (AlN), or aluminum oxide ($Al_2O_3$).

11. The method according to claim 1, after forming the first trench and the second trench, further comprising: removing the first patterned layer and the sidewall spacer material layer on the sidewall surface of the core layer.

12. The method according to claim 11, further comprising:

etching the to-be-etched layer at the bottom of the first trench to form a first target trench in the to-be-etched layer of the first region;

etching the to-be-etched layer at bottom of the second trench to form a second target trench in the to-be-etched layer of the second region;

forming a first conductive layer in the first target trench; and forming a second conductive layer in the second target trench.

* * * * *